(12) United States Patent
Matsumoto

(10) Patent No.: US 7,943,435 B2
(45) Date of Patent: May 17, 2011

(54) UNDERFILL FILM HAVING THERMALLY CONDUCTIVE SHEET

(75) Inventor: Keiji Matsumoto, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 12/164,085

(22) Filed: Jun. 29, 2008

(65) Prior Publication Data

US 2008/0261353 A1 Oct. 23, 2008

Related U.S. Application Data

(63) Continuation of application No. 11/299,155, filed on Dec. 9, 2005, now Pat. No. 7,416,923.

(51) Int. Cl.
*H01L 21/44* (2006.01)
*H01L 21/48* (2006.01)

(52) U.S. Cl. .. 438/127; 438/118; 438/108; 257/E21.503

(58) Field of Classification Search .................. 438/118, 438/108, 127; 257/E21.503, 783, 787
See application file for complete search history.

(56) References Cited

U.S. PATENT DOCUMENTS

| | | | | |
|---|---|---|---|---|
| 5,081,562 A | * | 1/1992 | Adachi et al. | 361/764 |
| 6,294,407 B1 | * | 9/2001 | Jacobs | 438/118 |
| 6,380,621 B1 | * | 4/2002 | Ando et al. | 257/707 |
| 6,644,395 B1 | * | 11/2003 | Bergin | 165/185 |
| 2003/0124326 A1 | * | 7/2003 | Nakatani et al. | 428/209 |

FOREIGN PATENT DOCUMENTS

| | | | |
|---|---|---|---|
| JP | 1997017923 A | | 1/1997 |
| JP | 1999233904 A | | 8/1999 |
| JP | 2001287299 A | | 10/2001 |
| JP | 2003133491 A | | 5/2003 |
| JP | 2005052542 A | | 3/2005 |
| JP | 2005305993 A | | 11/2005 |

* cited by examiner

*Primary Examiner* — Nitin Parekh
(74) *Attorney, Agent, or Firm* — Vazken Alexanian

(57) ABSTRACT

An underfill film for an electronic device includes a thermally conductive sheet. The electronic device may include a printed circuit board, an electrical component, an underfill, and the thermally conductive sheet. The underfill is situated between the circuit board and the component. The thermally conductive sheet is situated within the underfill, and together with the underfill, constitutes the underfill film. The device may include solder bumps affixing the component to the circuit board, the underfill film having holes within which the solder bumps are aligned. There may be solder bumps on the underside of the circuit board promoting heat dissipation. There may be heat sinks on the circuit board to which the thermally conductive sheet is affixed promoting heat dissipation. The thermally conductive sheet may be affixed to a chassis promoting heat dissipation. The thermally conductive sheet thus promotes heat dissipation from the component to at least the circuit board.

18 Claims, 6 Drawing Sheets

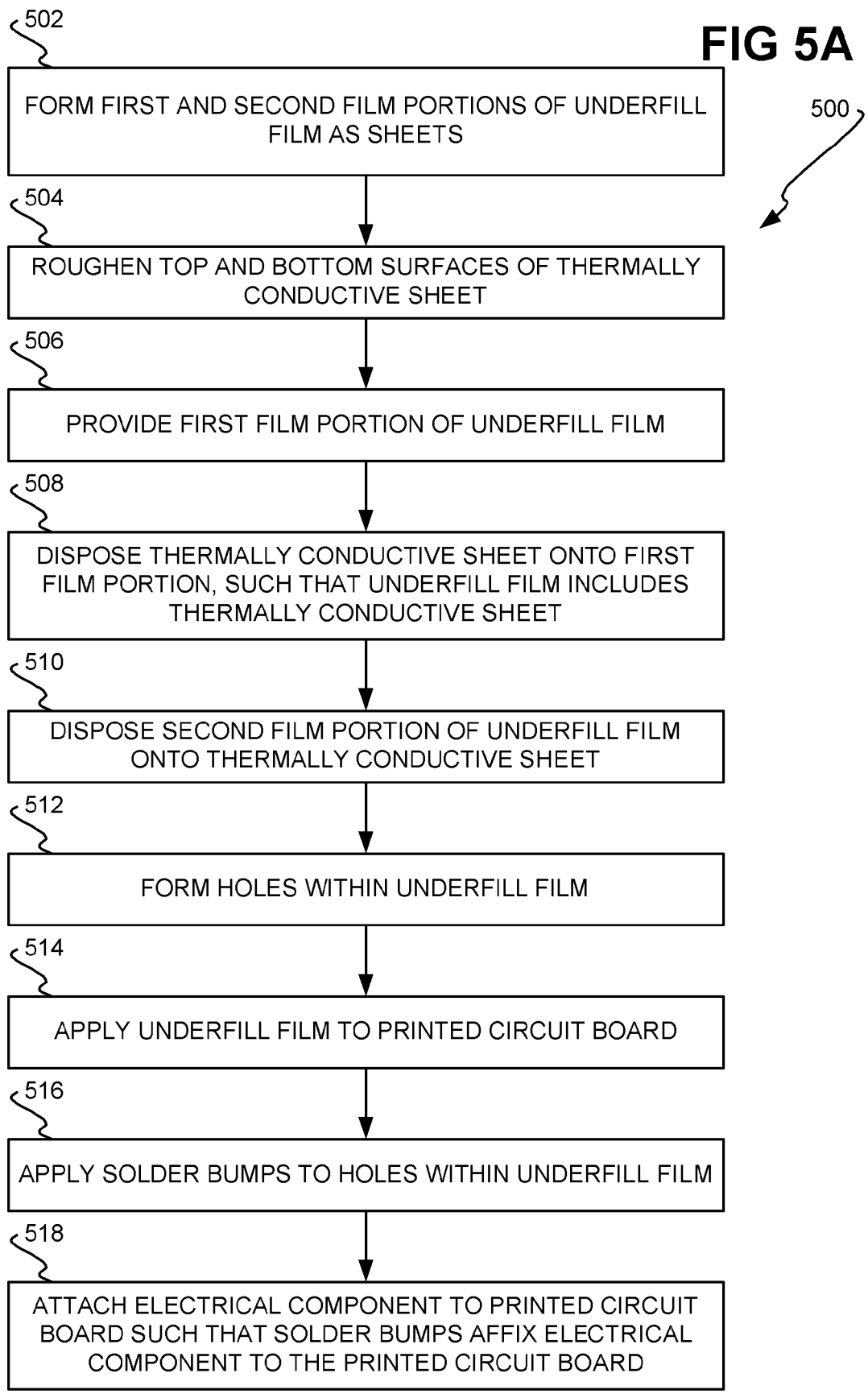

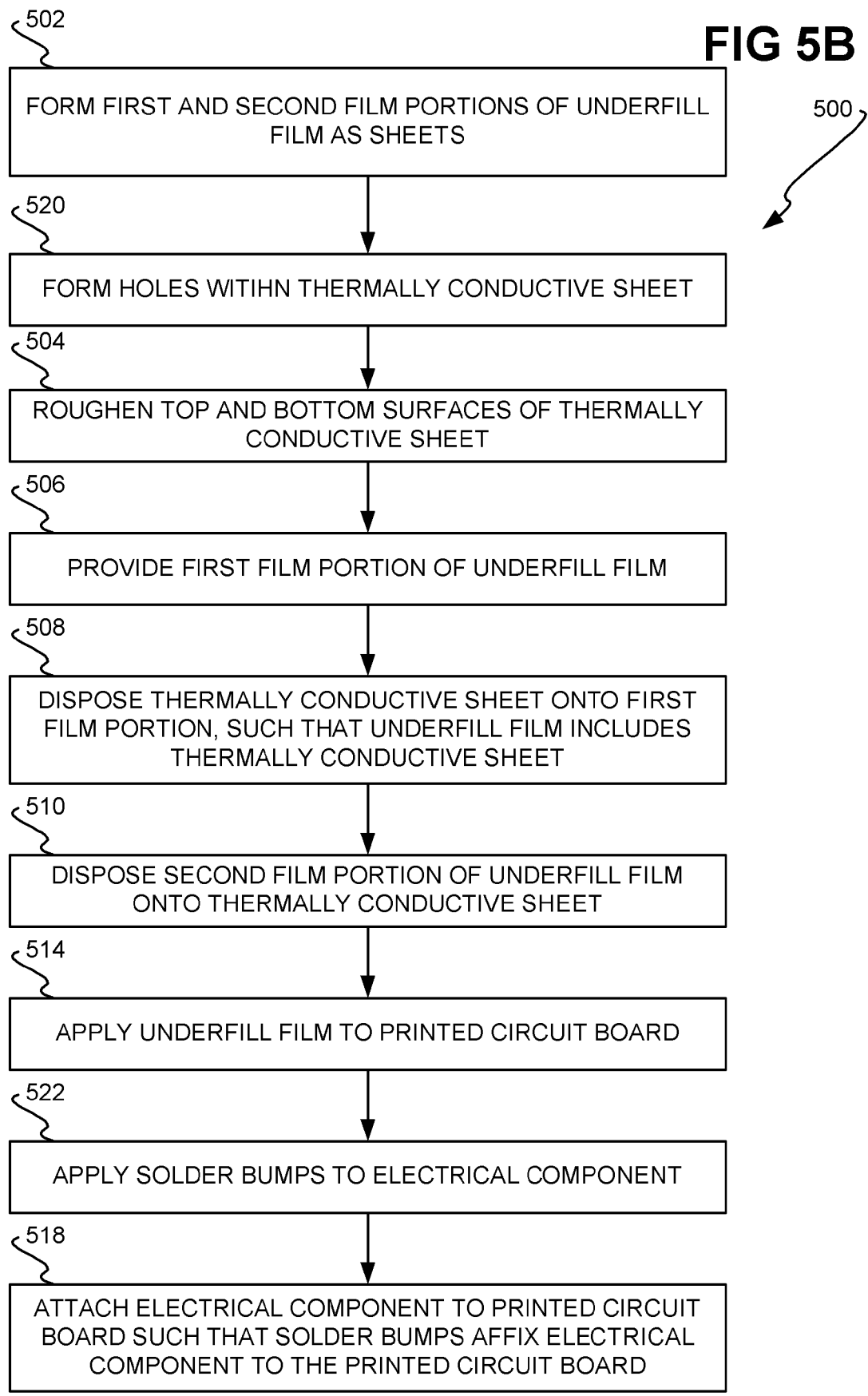

UNDERFILL FILM HAVING THERMALLY CONDUCTIVE SHEET

RELATED APPLICATIONS

The present patent application is a continuing patent application of the pending patent application entitled "underfill film having thermally conductive sheet," filed on Dec. 9, 2005, and assign Ser. No. 11/299,155.

FIELD OF THE INVENTION

The present invention relates generally to underfill films, which are disposed between electrical components mounted printed circuit boards of electronic devices via solder to relax stresses caused by coefficient of thermal expansion (CTE) differences between the solder and the electronic components and between the solder and the printed circuit boards. The present invention relates more particularly to such underfill films that include thermally conductive sheets to promote heat dissipation from the electrical components, where otherwise the underfill films have relatively poor thermal conductivity.

BACKGROUND OF THE INVENTION

Electronic devices commonly include printed circuit boards on which electrical components, such as integrated circuit (IC's) and other types of electrical components, are mounted and connected in particular ways to provide desired functionalities. A common approach to mount an electrical component to a printed circuit board is to use solder. More particularly, a number of solder bumps may be applied to the printed circuit board and heated, such that an electrical component can then be disposed to the solder bumps to affix the component to the circuit board.

Unfortunately, this approach to mounting electrical components to printed circuit boards can be problematic. Stresses can result from the differences in the coefficient of thermal expansion (CTE) of an electrical component and the CTE of solder, as well as from differences in the CTE of a printed circuit board and the CTE of the solder. During use of such an electrical device, for instance, if these stresses become too high, the solder may crack, causing the electrical component to no longer be properly affixed to the printed circuit board.

A solution to alleviate this problem is to include an underfill film between the electrical component and the printed circuit board of an electronic device. The underfill film itself relaxes the stresses resulting from CTE differences of the solder and the electrical component and the printed circuit board. Such stresses are thus absorbed by the film, instead of by the solder, reducing the likelihood that the electrical component may break way from the printed circuit board.

Another issue within electronic device design is the dissipation of heat. Modern IC's, for instance, can generate significant amounts of heat, which if not properly dissipated can cause failure of their electronic devices. Furthermore, electronic devices have become increasingly smaller, leading to printed circuit boards that are closely packed with electrical components. This means that using heat sinks for heat dissipation, as is conventional, can become problematic, because they may not be able to be located near the electrical components that require heat dissipation.

One solution is to add solder bumps, or balls, to the underside of a printed circuit board, which serve to dissipate heat through the printed circuit board. This approach is not overly effective, however, because the printed circuit board itself is usually not a good thermal conductive, such that the printed circuit board itself becomes a thermal insulator. Therefore, another approach, either alone or in combination with solder bumps on the underside of a printed circuit board, is to use the printed circuit board itself as a type of heat sink to dissipate heat.

For example, printed circuit boards may be manufactured using a resin that has a high thermal conductivity. Printed circuit boards using such resins are available, for instance, from Thermagon, Inc., of Cleveland, Ohio. As another example, printed circuit boards may incorporate graphite sheets to improve their thermal conductivity. Such printed circuit boards are available, for instance, from U-AI Electronics Corp., of Aichi, Japan. The graphite sheet may be caused to contact the metal or other chassis of the electronic device in question, to further improve heat dissipation, as described in the published Japanese patent application no. JP 1999-233904A, published on Aug. 27, 1999, and entitled "Heat release structure print substrate."

However, in order for a printed circuit board to effectively dissipate heat, there must be a thermally conductive path between the electrical components and the printed circuit board in the first place. Unfortunately, the inclusion of underfill films between the components and a printed circuit board effectively results in the components being thermally insulated from the printed circuit board. That is, most underfill films are made of a resin or another material that has low thermal conductivity. Therefore, heat does not efficiently travel from the electrical components to the printed circuit board.

A limited solution is to mix materials with high thermal conductivity into the underfill film material itself to improve thermal conductivity. For example, underfill available from AI Technology, Inc., of Princeton Junction, N.J., includes aluminum particles mixed into resin to improve the thermal conductivity of the resulting underfill film. However, this solution only transfers heat to the printed circuit board itself. Even a printed circuit board with a high thermal conductivity still has a thermal conductivity lower than most heat sinks, for instance, and therefore additional heat dissipation may be required. For instance, the printed circuit boards described above using thermally conductive resins still have relatively low thermal conductivity as compared to heat sinks.

For these and other reasons, therefore, there is a need for the present invention.

SUMMARY OF THE INVENTION

The present invention relates to an underfill film for an electronic device having a thermally conductive sheet. An electronic device of an embodiment of the invention, for instance, includes a printed circuit board, an electrical component, an underfill, and a thermally conductive sheet. The underfill is situated between the printed circuit board and the electrical component. The thermally conductive sheet is itself situated within the underfill. The underfill and the thermally conductive sheet make up the underfill film in one embodiment of the invention.

The electronic device may include solder bumps that affix the electrical component to the printed circuit board, where the underfill and the thermally conductive sheet have holes within which the solder bumps are aligned. There may further be solder bumps on the underside of the printed circuit board to promote heat dissipation. There may be heat sinks situated on the circuit board to which the thermally conductive sheet is affixed to promote heat dissipation as well. The thermally conductive sheet may further be affixed to a chassis for the electronic device to promote heat dissipation.

The thermally conductive sheet thus promotes heat dissipation from the electrical component to at least the printed circuit board. The underfill itself has relatively poor thermal conductivity, and may be a resin, for instance. By comparison, the thermally conductive sheet has high thermal conductivity, and may be a metal sheet, for instance. The thermally conductive sheet may be a graphite sheet or made from resin, such as silicone, as well. The coefficient of thermal expansion (CTE) of the thermally conductive sheet may be substantially equal to the CTE of the underfill itself, so that the resulting film including the underfill material and the thermally conductive sheet still functions to relieve the stresses described in the background section.

An underfill film of an embodiment of the invention is to be disposed between an electrical component of an electronic device and a circuit board of the electronic device. The electrical component is affixed to the circuit board by solder bumps. The underfill film includes a material, such as a resin having relatively poor thermal conductivity, and a thermally conductive sheet. The material, like the resin, is to relax thermal stresses resulting from the difference in the CTE's of the circuit board and the solder bumps, and from the difference in the CTE's of the electrical component and the solder bumps.

A method of an embodiment of the invention provides a first film portion of an underfill film and that has a relatively poor thermal conductivity. A thermally conductive sheet is disposed on the first film portion, such that the underfill film includes the thermally conductive sheet. A second film portion of the underfill film is then disposed on the thermally conductive sheet, and which also has a relatively poor thermal conductivity. Thus, the thermally conductive sheet is disposed within the underfill film.

The first and the second film portions may be initially formed as sheets. The top and bottom surfaces of the thermally conductive sheet may be roughened so that they adhere to the first and the second film portions of the underfill film. The underfill film may then be applied to a printed circuit board for an electronic device. Solder bumps can be applied to holes within the underfill film, which may have been previously formed by stamping, for instance. An electrical component of the electronic device is then attached to the printed circuit board. The solder bumps affix the component to the circuit board, and the underfill film is thus positioned between the component and the circuit board.

Embodiments of the invention therefore provide advantages over the prior art. Where a printed circuit board that has relatively good thermal conductivity is employed, heat is effectively dissipated to the circuit board from an electrical component mounted to the printed circuit board. This is because the underfill film between the component and the circuit board includes a thermally conductive sheet, providing the underfill film with high thermal conductivity. Alternatively or additionally, the thermally conductive sheet may be attached to a heat sink also mounted on the printed circuit board, and/or to a chassis of the electronic device. Therefore, heat is alternatively or also dissipated from the electrical component, to the thermally conductive sheet, and to finally the heat sink and/or to the chassis.

Still other advantages, aspects, and embodiments of the invention will become apparent by reading the detailed description that follows, and by referring to the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIGS. 5A and 5B are flowcharts of methods, according to varying embodiments of the invention.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
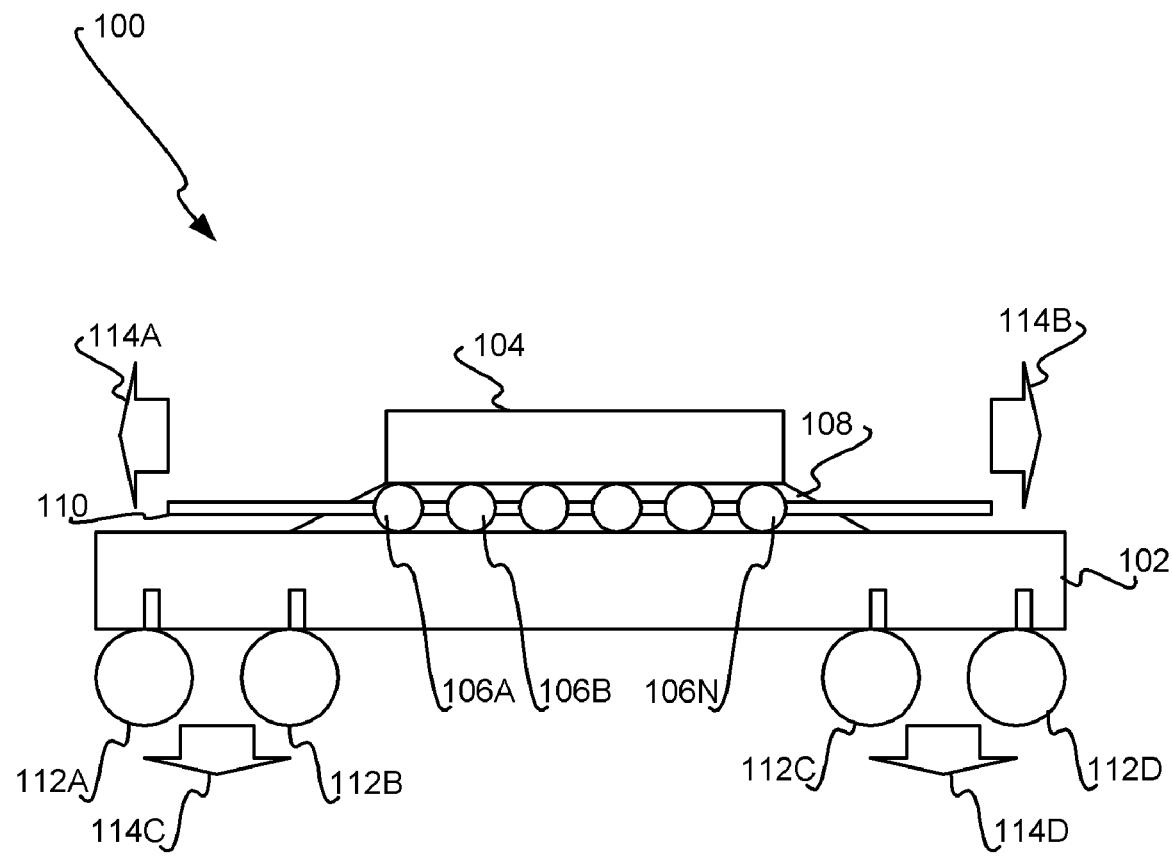
FIG. 1 is a diagram of an electronic device having an underfill film including a thermally conductive sheet to promote heat dissipation, according to a preferred embodiment of the invention, and is suggested for printing on the first page of the patent.

FIG. 1 shows an electronic device 100, according to an embodiment of the invention. The device 100 includes a printed circuit board 102 and an electrical component 104 mounted to the printed circuit board 102 via a number of solder bumps or balls 106A, 106B, . . . , 106N, collectively referred to as the solder bumps 106. The solder bumps 106 may be applied directly to the electrical component 104, through holes within an underfill 108 and/or a thermally conductive sheet 110, as will be described. In one embodiment, there are only holes within the sheet 110, such that the solder bumps can penetrate any portions of the underfill 108 as needed. The solder bumps 106 may also be applied to the printed circuit board 102. The electrical component 104 may be a semiconductor integrated circuit (IC), or another type of electrical component. The electrical component 104 is a source of heat, and thus generates heat that needs to be dissipated. The printed circuit board 102 is more generally considered a circuit board.

The device 100 also includes an underfill film that is made up of the underfill 108 and the thermally conductive sheet 110. More particularly, the underfill 108 is situated between the circuit board 102 and the electrical component 104. The thermally conductive sheet 110 is situated within the underfill 108. The underfill 108 itself is at least a relatively poor thermal conductor, and thus has poor or low thermal conductivity. For instance, the underfill 108 may be a material like a resin. For instance, the underfill may be that which is available from Sumitomo Bakelite Co., Ltd., of Tokyo, Japan.

By comparison, the thermally conductive sheet 110 itself is a good thermal conductor, and thus has good or high thermal conductivity. For instance, the thermally conductive sheet 110 may be a sheet of metal, like copper, aluminum, or another metal. The thermally conductive sheet 110 may also be a thermally conductive graphite sheet, such as that which is available from Otsuka Electric Co., Ltd., of Osaka, Japan.

The thermally conductive sheet 110 renders the underfill film a good thermal conductor with good thermal conductivity. As a result, heat generated by the electrical component 104 is thermally conducted to the thermally conductive sheet 110 of the underfill film. In one embodiment, the sheet 110 extends outwards from the underfill 108, as depicted in FIG. 1, such that the sheet 110 can dissipate the heat outwards as indicated by the arrows 114A and 114B. In another embodiment, the circuit board 102 is itself thermally conductive to at least some degree. Therefore, the sheet 110 can further thermally conduct the heat to the circuit board 102 itself, which may dissipate some this heat generated by the component 104.

Furthermore, the electronic device 100 may also include a number of solder bumps, or balls, 112A, 112B, 112C, and 112D, collectively referred to as the solder bumps 112, mounted on the underside of the printed circuit board 102. These solder bumps 112 also dissipate heat, as indicated by the arrows 114C and 114D. That is, the heat generated by the electrical component 104 is thermally conducted through the thermally conductive sheet 110 of the underfill film, through the printed circuit board, and finally to the solder bumps 112, where it can be dissipated. In all of these ways, then, varying embodiments of the invention promote heat dissipation.

The underfill film relaxes thermal stresses that result from the coefficient of thermal expansion (CTE) of the printed circuit board 102 being significantly different than the CTE of the solder bumps 106, and/or from the CTE of the electrical component 104 being significantly different than the CTE of the solder bumps 106. In one embodiment, the CTE of the underfill 108 primarily contributes to the underfill film providing this functionality. However, preferably the CTE of the thermally conductive sheet 110 is substantially equal to the CTE of the underfill 108 itself. Thus, the inclusion of the thermally conductive sheet 110 into the underfill film, along with the underfill 108, does not affect alter the functionality of the underfill 108 to relax thermal stresses.

The electronic device 100 may be any type of electronic device, such as a computing device, an audio/video device, and so on. As can be appreciated by those of ordinary skill within the art, typically the device 100 will have addition components, besides the electrical component 104 of FIG. 1. As can also be appreciated by those of ordinary skill within the art, the size and shape of the various parts of the electronic device 100 are exaggerated and not drawn to scale in FIG. 1, for illustrative clarity.

Figure 2A:
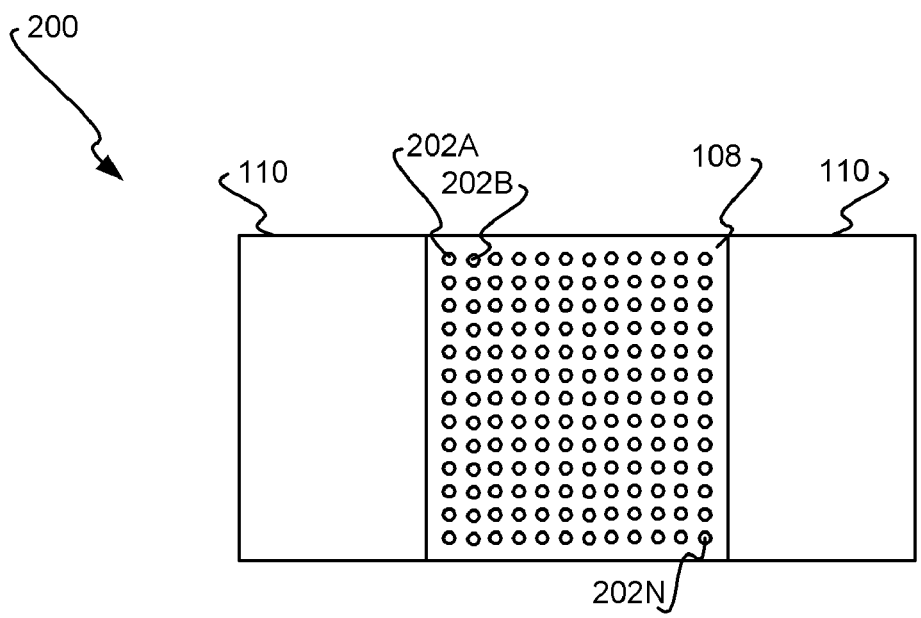
FIGS. 2A and 2B are a top-view diagram and a cross-sectional side view diagram, respectively, of an underfill film having a thermally conductive sheet, according to an embodiment of the invention.
Figure 2B:
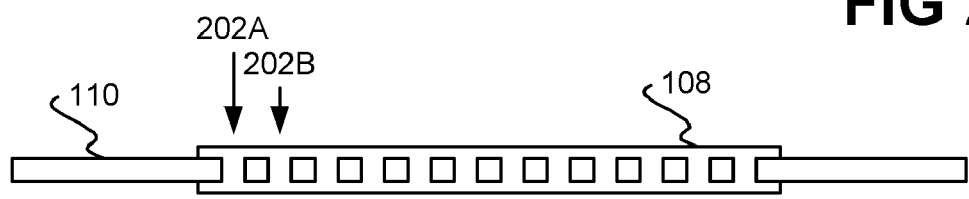

FIGS. 2A and 2B show an underfill film 200, made up of the underfill 108 and the thermally conductive sheet 110, in more detail, according to an embodiment of the invention. FIG. 2A specifically shows a top view of the underfill film 200. By comparison FIG. 2B specifically shows a cross-sectional side view of the underfill film 200.

The length from left to right of the underfill film 200 in FIG. 2A may be about 50 millimeters (mm), with the underfill 108 having a length of 25 mm, such that there are about 12½ mm of the thermally conductive sheet 110 to either side of the underfill 108. The width from top to bottom of the underfill film 200 in FIG. 2A may be about 25 mm. The thickness of the entirety of the underfill film 200 in FIG. 2B may be about 180 micrometers (microns), with the underfill 108 having a thickness of 180 microns, and the conductive sheet 110 having a thickness of about 80 microns and substantially centered from top to bottom within the underfill 108.

There are a number of holes 202A, 202B, . . . , 202N, collectively referred to as the holes 202, disposed within the underfill film 200, including at least through the thermally conductive sheet 110, and also in one embodiment through the underfill 108. The holes 202 correspond to the solder bumps 106 of FIG. 1. That is, the holes 202 are aligned with the solder bumps 106, and vice-versa.

For instance, once the underfill film 200 has been applied to the printed circuit board 102 of FIG. 1, solder can be applied within the holes to create the solder bumps 106. Thereafter, the electrical component 104 of FIG. 1 can be mounted to the printed circuit board 102, by being affixed to the solder bumps 106. Each of the holes may have diameters of 320 microns, where the solder bumps themselves have diameters of 200 microns. The extra 120 microns provides a degree of latitude in application of the solder to create the solder bumps 106, to allow for misalignment, for instance.

Figure 3:
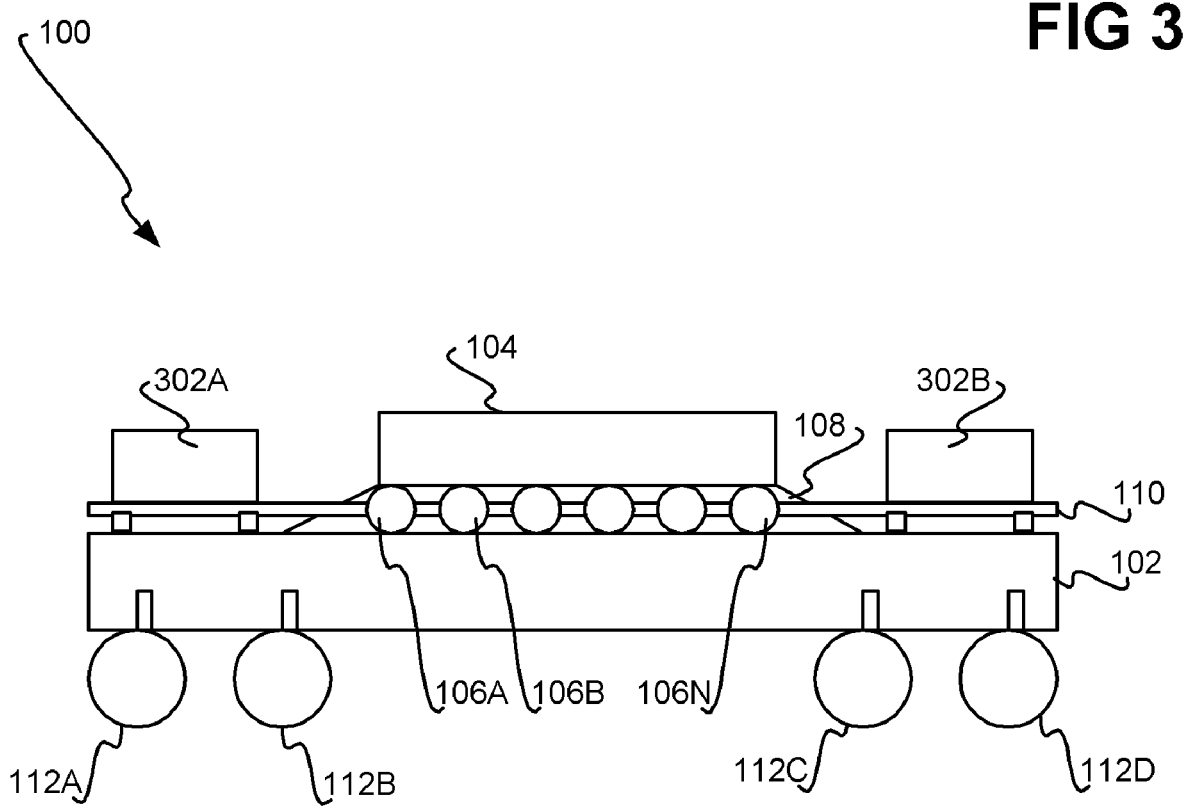
FIG. 3 is a diagram of an electronic device in which a thermally conductive sheet of an underfill film is connected to a number of heat sinks to promote heat dissipation, according to an embodiment of the invention.

The thermally conductive sheet 110 can be connected to other parts and components of the electronic device 100 of FIG. 1 to further promote heat dissipation. FIG. 3 shows the thermally conductive sheet 110 of the electronic device 100 being connected to two heat sinks 302A and 302B, collectively referred to as the heat sinks 302, according to an embodiment of the invention. Like-numbered parts between FIGS. 1 and 3 operate at least substantially the same in FIG. 3 as in FIG. 1, and such description is not repeated here to avoid redundancy. The heat sinks 302 are part of the electronic device 100.

The heat sinks 302 are mounted on the printed circuit board 102. Because the thermally conductive sheet 110 is connected to the heat sinks 302, further heat dissipation is promoted. Heat generated by the electrical component 104 is thermally conducted to the thermally conductive sheet 110 of the underfill film, and to the heat sinks 302, where the heat can be dissipated. The heat sinks 302 can thus be located farther away from the electrical component 104 than is conventional, since usually heat sinks have to be in close physical contact with the electrical components that they are intended to cool. Therefore, utilizing the conductive sheet 110 is advantageous, as there may be insufficient room on the board 102 to locate the sinks 302 close to the component 104.

Figure 4:
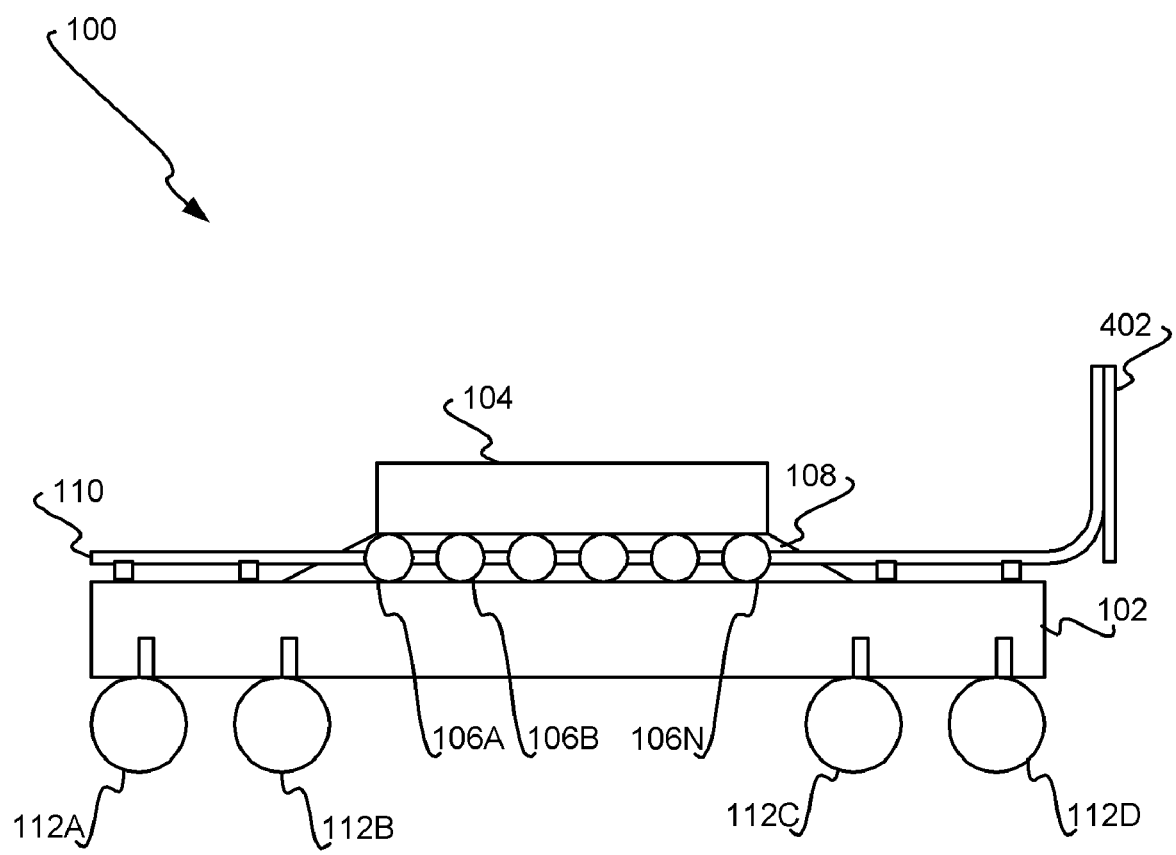
FIG. 4 is a diagram of an electronic device in which a thermally conductive sheet of an underfill film is connected to a chassis to promote heat dissipation, according to an embodiment of the invention.

FIG. 4 shows the thermally conductive sheet 110 of the electronic device 100 being connected to a chassis 402, according to an embodiment of the invention. Like-numbered parts between FIGS. 1 and 4 operate at least substantially the same in FIG. 4 as in FIG. 1, and such description is not repeated here to avoid redundancy. The chassis 402 may be part of or for the electronic device 100. For instance, the chassis 402 may be an enclosure for the device 100, and is typically fabricated from metal, or another type of material that has high thermal conductivity.

Because the thermally conductive sheet 110 is connected to the chassis 402, further heat dissipation is promoted. Heat generated by the electrical component 104 is thermally conductive to the thermally conductive sheet 110 of the underfill film, and to the chassis 402, where the heat can be dissipated. Therefore, utilizing the conductive sheet 110 is advantageous, because it allows the chassis 402 to be used for heat dissipation purposes. It is noted that in one embodiment, the thermally conductive sheet 110 may be connected to one or more heat sinks, as in FIG. 3, in addition to a chassis, as in FIG. 4.

FIG. 5A shows a method 500, according to an embodiment of the invention. First, first and second film portions of the underfill film 200 are formed as sheets (502). The first film portion is the top part of the underfill 108 of FIG. 1, for instance, between the electrical component 104 and the thermally conductive sheet 110. The second film portion is the bottom part of the underfill 108 of FIG. 1, for instance, between the thermally conductive sheet 110 and the printed circuit board 102. Next, in one embodiment, the top and bottom surfaces of the thermally conductive sheet 110 are roughened (504). Roughening promotes subsequent adhesion of these surfaces of the conductive sheet 110 to the first and second film portions of the underfill film 200, especially where the sheet 110 is a copper sheet.

Thus, the first film portion of the underfill film 200 is provided (506), and the thermally conductive sheet 110 is disposed onto the first film portion (508), such that it adheres thereto, and such that the underfill film 200 is said to include the sheet 110. The second film portion of the underfill film 200 can then be disposed onto the thermally conductive sheet 110 (510), such that it adheres thereto, and such that the underfill film 200 now includes the underfill 108 and the conductive sheet 110 as depicted in FIG. 1. The holes 202 may then be formed within the underfill film 200 (512), for solder to be subsequently disposed therein, and the film 200 may be applied to the printed circuit board 102 (514). The holes 202 may be formed by a stamping process, or another type of conventional or unconventional process.

Thereafter, the solder bumps 106 are applied to the printed circuit board 102 within the holes 202 within the underfill film 200 (516). The electrical component 104 is finally attached to the printed circuit board 102 (518). That is, the solder bumps 106 affix the electrical component 104 to the printed circuit board 102, with the underfill film 200 positioned between the component 104 and the circuit board 102. As has been described, the presence of the thermally conductive sheet 110 within this film 200 thus promotes greater heat dissipation from the electrical component 104, in a variety of different ways.

FIG. 5B shows another embodiment of the method 500, according to a different embodiment than that of FIG. 5A. Like-numbered components between FIGS. 5A and 5B are performed at least substantially the same in FIG. 5B as in FIG. 5A, and the discussion thereof in relation to FIG. 5A is not repeated in relation to FIG. 5B to avoid redundancy. The method 500 as depicted in FIG. 5B is thus similar to the method 500 as depicted in FIG. 5A, with some differences.

As before, first and second film portions of the underfill film 200 are formed as sheets (502). However, next, in one embodiment the holes 202 are formed within the thermally conductive sheet 110 (520), and thus are not formed within the first and second film portions of the underfill film 200. This is because the solder bumps 106 that will be aligned with the holes 202 are able to penetrate the first and second film portions of the underfill film 200. The holes 202 may be formed by a stamping process, or another type of conventional or unconventional process.

Next, in one embodiment, the top and bottom surfaces of the thermally conductive sheet 110 are roughened (504). The first film portion of the underfill film 200 is provided (506), and the thermally conductive sheet 110 is disposed onto the first film portion (508), such that it adheres thereto, as before, and such that the underfill film 200 is said to include the sheet 110. The second film portion of the underfill film 200 can then be disposed onto the thermally conductive sheet 110 (510), such that it adheres thereto, and such that the underfill film 200 now includes the underfill 108 and the conductive sheet 110 as depicted in FIG. 1.

The film 200 may now be applied to the printed circuit board 102 (514). Thereafter, the solder bumps 106 are applied to the electrical component 104, as opposed to the printed circuit board 102 as in FIG. 5A, within the holes 202 (22). The electrical component 104 is finally attached to the printed circuit board 102 (518). That is, the solder bumps 106 affix the electrical component 104 to the printed circuit board 102, with the underfill film 200 positioned between the component 104 and the circuit board 102. As has been noted, the presence of the thermally conductive sheet 110 within this film 200 thus promotes greater heat dissipation from the electrical component 104, in a variety of different ways.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. Therefore, it is manifestly intended that this invention be limited only by the claims and equivalents thereof.

I claim:

1. A method comprising:
    providing a first film portion of an underfill film, the first film portion having a poor thermal conductivity relative to a thermally conductive sheet of the underfill film;
    disposing the thermally conductive sheet on the first film portion of the underfill film, such that the underfill film includes the thermally conductive sheet; and,
    disposing a second film portion of the underfill film on the thermally conductive sheet, the second film portion having the poor thermal conductivity,
    such that the thermally conductive sheet is disposed within the underfill film,
    wherein the thermally conductive sheet has a coefficient of thermal expansion (CTE) substantially equal to a CTE of the underfill film, such that inclusion of the thermally conductive sheet within the underfill film does not affect a functionality of the underfill film to relax thermal stresses.

2. The method of claim 1, further comprising initially forming the first film portion and the second film portion of the underfill film as sheets.

3. The method of claim 1, further comprising roughening a top surface and a bottom surface of the thermally conductive sheet so that the thermally conductive sheet adheres to the first film portion and the second film portion of the underfill film.

4. The method of claim 1, further comprising:
    applying the underfill film, including the first film portion, the thermally conductive sheet, and the second film portion, to a printed circuit board for an electronic device;
    applying a plurality of solder bumps to a corresponding plurality of holes within the underfill film; and,
    attaching an electrical component of the electronic device to the printed circuit board,
    such that the solder bumps affix the electrical component to the printed circuit board, and such that the underfill film is positioned between the electrical component and the printed circuit board.

5. The method of claim 1, further comprising:
    applying the underfill film, including the first film portion, the thermally conductive sheet, and the second film portion, to a printed circuit board for an electronic device;
    applying a plurality of solder bumps to an electrical component of the electronic device; and, attaching an electrical component of the electronic device to the printed circuit board, such that the solder bumps affix the electrical component to the printed circuit board, and such that the underfill film is positioned between the electrical component and the printed circuit board.

6. The method of claim 5, further comprising forming a plurality of holes within the underfill film, including the first film portion, the thermally conductive sheet, and the second film portion, where the holes permit solder bumps to be applied to the printed circuit board through the underfill film.

7. The method of claim 5, further comprising forming a plurality of holes within the underfill film, including the first film portion, the thermally conductive sheet, and the second film portion, where the holes permit solder bumps on an electrical component of the electronic device to be applied to the printed circuit board through the underfill film.

8. The method of claim 5, further comprising:
disposing one or more heat sinks on the printed circuit board; and,
affixing the heat sinks to the thermally conductive sheet to promote heat dissipation from the electrical component to the heat sinks.

9. The method of claim 5, further comprising:
providing a chassis for the electronic device; and,
affixing the chassis to the thermally conductive sheet to promote heat dissipation from the electrical component to the chassis.

10. A method comprising:
providing a first film portion of an underfill film, the first film portion having a poor thermal conductivity relative to a thermally conductive sheet of the underfill film;
disposing the thermally conductive sheet on the first film portion of the underfill film, where plurality of holes are fabricated within the thermally conductive sheet, and such that the underfill film includes the thermally conductive sheet; and,
disposing a second film portion of the underfill film on the thermally conductive sheet, the second film portion having the poor thermal conductivity,
such that the thermally conductive sheet is disposed within the underfill film,
wherein the thermally conductive sheet has a coefficient of thermal expansion (CTE) substantially equal to a CTE of the underfill film, such that inclusion of the thermally conductive sheet within the underfill film does not affect a functionality of the underfill film to relax thermal stresses.

11. The method of claim 10, further comprising initially forming the first film portion and the second film portion of the underfill film as sheets.

12. The method of claim 10, further comprising roughening a top surface and a bottom surface of the thermally conductive sheet so that the thermally conductive sheet adheres to the first film portion and the second film portion of the underfill film.

13. The method of claim 10, further comprising:
applying the underfill film, including the first film portion, the thermally conductive sheet, and the second film portion, to a printed circuit board for an electronic device;
applying a plurality of solder bumps to a corresponding plurality of holes within the thermally conductive sheet; and,
attaching an electrical component of the electronic device to the printed circuit board,
such that the solder bumps affix the electrical component to the printed circuit board, and such that the underfill film is positioned between the electrical component and the printed circuit board.

14. The method of claim 10, further comprising:
applying the underfill film, including the first film portion, the thermally conductive sheet, and the second film portion, to a printed circuit board for an electronic device;
applying a plurality of solder bumps to an electrical component of the electronic device; and,
attaching an electrical component of the electronic device to the printed circuit board,
such that the solder bumps affix the electrical component to the printed circuit board, and such that the underfill film is positioned between the electrical component and the printed circuit board.

15. The method of claim 14, further comprising forming a plurality of holes within the thermally conductive sheet, where the holes permit solder bumps to be applied to the printed circuit board through the thermally conductive sheet.

16. The method of claim 14, further comprising forming a plurality of holes within the thermally conductive sheet, where the holes permit solder bumps on an electrical component of the electronic device to be applied to the printed circuit board through the thermally conductive sheet.

17. The method of claim 14, further comprising:
disposing one or more heat sinks on the printed circuit board; and,
affixing the heat sinks to the thermally conductive sheet to promote heat dissipation from the electrical component to the heat sinks.

18. The method of claim 14, further comprising:
providing a chassis for the electronic device; and,
affixing the chassis to the thermally conductive sheet to promote heat dissipation from the electrical component to the chassis.

* * * * *